(12) United States Patent
Perlmutter et al.

(10) Patent No.: US 7,924,587 B2
(45) Date of Patent: Apr. 12, 2011

(54) PROGRAMMING OF ANALOG MEMORY CELLS USING A SINGLE PROGRAMMING PULSE PER STATE TRANSITION

(75) Inventors: Uri Perlmutter, Holon (IL); Shai Winter, Givatayim (IL); Ofir Shalvi, Ra'anana (IL); Eyal Gurgi, Petach-Tikva (IL); Naftali Sommer, Rishon Lezion (IL); Oren Golov, Hod-Hasharon (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 0 days.

(21) Appl. No.: 12/388,528

(22) Filed: Feb. 19, 2009

(65) Prior Publication Data

US 2009/0213653 A1    Aug. 27, 2009

Related U.S. Application Data

(60) Provisional application No. 61/030,240, filed on Feb. 21, 2008, provisional application No. 61/031,712, filed on Feb. 27, 2008.

(51) Int. Cl.
*G11C 27/00* (2006.01)

(52) U.S. Cl. .................. 365/45; 365/189.07; 365/210.2; 365/185.03; 365/185.24

(58) Field of Classification Search .................... 365/45, 365/189.07, 210.1, 185.03, 185.24
See application file for complete search history.

(56) References Cited

U.S. PATENT DOCUMENTS

| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,172,338 A | 12/1992 | Mehrotta et al. |
| 5,191,584 A | 3/1993 | Anderson |
| 5,200,959 A | 4/1993 | Gross et al. |

(Continued)

FOREIGN PATENT DOCUMENTS

EP    0783754 B1    7/1997

(Continued)

OTHER PUBLICATIONS

U.S. Appl. No. 12/019,011 Official Action dated Nov. 20, 2009.

(Continued)

*Primary Examiner* — Viet Q Nguyen
(74) *Attorney, Agent, or Firm* — D. Kligler I.P. Services Ltd.

(57) ABSTRACT

A method for data storage in analog memory cells includes defining multiple programming states for storing data in the analog memory cells. The programming states represent respective combinations of more than one bit and correspond to respective, different levels of a physical quantity stored in the memory cells. The data is stored in the memory cells by applying to the memory cells programming pulses that cause the levels of the physical quantity stored in the memory cells to transition between the programming states, such that a given transition is caused by only a single programming pulse.

28 Claims, 2 Drawing Sheets

U.S. PATENT DOCUMENTS

| | | | |
|---|---|---|---|
| 5,237,535 A | 8/1993 | Mielke et al. | |
| 5,272,669 A | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,646 A | 5/1995 | Shirai | |
| 5,416,782 A | 5/1995 | Wells et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,541,886 A | 7/1996 | Hasbun | |
| 5,600,677 A | 2/1997 | Citta et al. | |
| 5,657,332 A | 8/1997 | Auclair et al. | |
| 5,675,540 A | 10/1997 | Roohparvar | |
| 5,682,352 A | 10/1997 | Wong et al. | |
| 5,696,717 A | 12/1997 | Koh | |
| 5,726,649 A | 3/1998 | Tamaru et al. | |
| 5,742,752 A | 4/1998 | De Koning | |
| 5,751,637 A | 5/1998 | Chen et al. | |
| 5,761,402 A | 6/1998 | Kaneda et al. | |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,429 A | 2/1999 | Chen et al. | |
| 5,877,986 A | 3/1999 | Harari et al. | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,991,517 A | 11/1999 | Harari et al. | |
| 5,995,417 A | 11/1999 | Chen et al. | |
| 6,009,014 A | 12/1999 | Hollmer et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,166,962 A | 12/2000 | Chen et al. | |
| 6,178,466 B1 | 1/2001 | Gilbertson et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,275,419 B1 | 8/2001 | Guterman et al. | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 * | 4/2002 | Torelli et al. | 365/185.19 |
| 6,396,742 B1 | 5/2002 | Korsh et al. | |
| 6,397,364 B1 | 5/2002 | Barkan | |
| 6,405,323 B1 | 6/2002 | Lin et al. | |
| 6,418,060 B1 | 7/2002 | Yong et al. | |
| 6,442,585 B1 | 8/2002 | Dean et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,558,967 B1 | 5/2003 | Wong | |
| 6,560,152 B1 | 5/2003 | Cernea | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzalez et al. | |
| 6,643,169 B2 | 11/2003 | Rudelic et al. | |
| 6,678,192 B2 | 1/2004 | Gongwer et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,717,847 B2 | 4/2004 | Chen | |
| 6,731,557 B2 | 5/2004 | Beretta | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,807,095 B2 | 10/2004 | Chen et al. | |
| 6,809,964 B2 | 10/2004 | Moschopoulos et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,894,926 B2 | 5/2005 | Guterman et al. | |
| 6,907,497 B2 | 6/2005 | Hosono et al. | |
| 6,930,925 B2 | 8/2005 | Guo et al. | |
| 6,934,188 B2 | 8/2005 | Roohparvar | |
| 6,937,511 B2 * | 8/2005 | Hsu et al. | 365/185.03 |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 7,002,843 B2 | 2/2006 | Guterman et al. | |
| 7,012,835 B2 | 3/2006 | Gonzales et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,039,846 B2 | 5/2006 | Hewitt et al. | |
| 7,042,766 B1 * | 5/2006 | Wang et al. | 365/185.22 |
| 7,054,193 B1 | 5/2006 | Wong | |
| 7,054,199 B2 * | 5/2006 | Lee et al. | 365/185.22 |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,079,555 B2 | 7/2006 | Baydar et al. | |
| 7,088,615 B2 | 8/2006 | Guterman et al. | |
| 7,099,194 B2 | 8/2006 | Tu et al. | |
| 7,102,924 B2 | 9/2006 | Chen et al. | |
| 7,113,432 B2 | 9/2006 | Mokhlesi | |
| 7,130,210 B2 | 10/2006 | Bathul et al. | |
| 7,139,192 B1 | 11/2006 | Wong | |
| 7,139,198 B2 | 11/2006 | Guterman et al. | |
| 7,151,692 B2 * | 12/2006 | Wu | 365/185.03 |
| 7,170,802 B2 | 1/2007 | Cernea et al. | |
| 7,173,859 B2 | 2/2007 | Hemink | |
| 7,177,184 B2 | 2/2007 | Chen | |
| 7,177,195 B2 | 2/2007 | Gonzales et al. | |
| 7,177,199 B2 | 2/2007 | Chen et al. | |
| 7,177,200 B2 | 2/2007 | Ronen et al. | |
| 7,184,338 B2 * | 2/2007 | Nakagawa et al. | 365/201 |
| 7,187,195 B2 | 3/2007 | Kim | |
| 7,187,592 B2 | 3/2007 | Guterman et al. | |
| 7,190,614 B2 * | 3/2007 | Wu | 365/185.03 |
| 7,193,898 B2 | 3/2007 | Cernea | |
| 7,193,921 B2 | 3/2007 | Choi et al. | |
| 7,196,928 B2 | 3/2007 | Chen | |
| 7,197,594 B2 | 3/2007 | Raz et al. | |
| 7,200,062 B2 | 4/2007 | Kinsely et al. | |

| | | |
|---|---|---|
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,257,027 B2 | 8/2007 | Park |
| 7,259,987 B2 | 8/2007 | Chen et al. |
| 7,266,026 B2 | 9/2007 | Gongwer et al. |
| 7,274,611 B2 | 9/2007 | Roohparvar |
| 7,277,355 B2 | 10/2007 | Tanzawa |
| 7,280,398 B1 | 10/2007 | Lee et al. |
| 7,280,409 B2 | 10/2007 | Misumi et al. |
| 7,289,344 B2 | 10/2007 | Chen |
| 7,301,807 B2 | 11/2007 | Khalid et al. |
| 7,301,817 B2 * | 11/2007 | Li et al. ............... 365/185.22 |
| 7,308,525 B2 | 12/2007 | Lasser et al. |
| 7,310,255 B2 | 12/2007 | Chan |
| 7,310,272 B1 | 12/2007 | Mokhlesi et al. |
| 7,310,347 B2 | 12/2007 | Lasser |
| 7,321,509 B2 | 1/2008 | Chen et al. |
| 7,342,831 B2 | 3/2008 | Mokhlesi et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,397,697 B2 | 7/2008 | So et al. |
| 7,408,804 B2 | 8/2008 | Hemink et al. |
| 7,409,473 B2 | 8/2008 | Conley et al. |
| 7,420,847 B2 | 9/2008 | Li |
| 7,433,231 B2 | 10/2008 | Aritome |
| 7,437,498 B2 | 10/2008 | Ronen |
| 7,440,324 B2 | 10/2008 | Mokhlesi |
| 7,441,067 B2 | 10/2008 | Gorobets et al. |
| 7,453,737 B2 | 11/2008 | Ha |
| 7,460,410 B2 * | 12/2008 | Nagai et al. ............... 365/185.28 |
| 7,460,412 B2 * | 12/2008 | Lee et al. ............... 365/185.3 |
| 7,466,592 B2 | 12/2008 | Mitani et al. |
| 7,468,911 B2 | 12/2008 | Lutze et al. |
| 7,471,581 B2 | 12/2008 | Tran et al. |
| 7,492,641 B2 * | 2/2009 | Hosono et al. ........... 365/185.22 |
| 7,508,710 B2 | 3/2009 | Mokhlesi |
| 7,539,062 B2 | 5/2009 | Doyle |
| 7,551,492 B2 | 6/2009 | Kim |
| 7,570,520 B2 | 8/2009 | Kamei et al. |
| 7,593,259 B2 | 9/2009 | Kim et al. |
| 7,596,707 B1 | 9/2009 | Vemula |
| 7,631,245 B2 | 12/2009 | Lasser |
| 7,633,802 B2 | 12/2009 | Mokhlesi |
| 7,656,734 B2 | 2/2010 | Thorp et al. |
| 7,660,158 B2 | 2/2010 | Aritome |
| 7,660,183 B2 | 2/2010 | Ware et al. |
| 7,742,351 B2 | 6/2010 | Inoue et al. |
| 7,885,119 B2 | 2/2011 | Li |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0118574 A1 | 8/2002 | Gongwer et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0203546 A1 | 9/2006 | Lasser |
| 2006/0218359 A1 | 9/2006 | Sanders et al. |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |

| | | | |
|---|---|---|---|
| 2008/0115017 A1 | 5/2008 | Jacobson | |
| 2008/0123420 A1 | 5/2008 | Brandman et al. | |
| 2008/0126686 A1 | 5/2008 | Sokolov et al. | |
| 2008/0130341 A1 | 6/2008 | Shalvi et al. | |
| 2008/0148115 A1 | 6/2008 | Sokolov et al. | |
| 2008/0151618 A1 | 6/2008 | Sharon et al. | |
| 2008/0151667 A1 | 6/2008 | Miu et al. | |
| 2008/0158958 A1 | 7/2008 | Sokolov et al. | |
| 2008/0181001 A1 | 7/2008 | Shalvi | |
| 2008/0198650 A1 | 8/2008 | Shalvi et al. | |
| 2008/0209116 A1 | 8/2008 | Caulkins | |
| 2008/0209304 A1 | 8/2008 | Winarski et al. | |
| 2008/0215798 A1 | 9/2008 | Sharon et al. | |
| 2008/0219050 A1 | 9/2008 | Shalvi et al. | |
| 2008/0239093 A1 | 10/2008 | Easwar et al. | |
| 2008/0239812 A1 | 10/2008 | Abiko et al. | |
| 2008/0263262 A1 | 10/2008 | Sokolov et al. | |
| 2008/0282106 A1 | 11/2008 | Shalvi et al. | |
| 2009/0013233 A1 | 1/2009 | Radke | |
| 2009/0024905 A1 | 1/2009 | Shalvi et al. | |
| 2009/0034337 A1 | 2/2009 | Aritome | |
| 2009/0043831 A1 | 2/2009 | Antonopoulos et al. | |
| 2009/0043951 A1 | 2/2009 | Shalvi et al. | |
| 2009/0049234 A1 | 2/2009 | Oh et al. | |
| 2009/0073762 A1 | 3/2009 | Lee et al. | |
| 2009/0086542 A1 | 4/2009 | Lee et al. | |
| 2009/0089484 A1 | 4/2009 | Chu | |
| 2009/0091979 A1 | 4/2009 | Shalvi | |
| 2009/0094930 A1 | 4/2009 | Schwoerer | |
| 2009/0106485 A1 | 4/2009 | Anholt | |
| 2009/0112949 A1 | 4/2009 | Ergan et al. | |
| 2009/0132755 A1 | 5/2009 | Radke | |
| 2009/0144600 A1 | 6/2009 | Perlmutter et al. | |
| 2009/0150894 A1 | 6/2009 | Huang et al. | |
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0172257 A1 | 7/2009 | Prins et al. | |
| 2009/0172261 A1 | 7/2009 | Prins et al. | |
| 2009/0199074 A1 | 8/2009 | Sommer et al. | |
| 2009/0204824 A1 | 8/2009 | Lin et al. | |
| 2009/0204872 A1 | 8/2009 | Yu et al. | |
| 2009/0213653 A1 | 8/2009 | Perlmutter et al. | |
| 2009/0213654 A1 | 8/2009 | Perlmutter et al. | |
| 2009/0225595 A1 | 9/2009 | Kim | |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann | |
| 2010/0017650 A1 | 1/2010 | Chin et al. | |
| 2010/0034022 A1 | 2/2010 | Dutta et al. | |
| 2010/0057976 A1 | 3/2010 | Lasser | |
| 2010/0061151 A1 | 3/2010 | Miwa et al. | |
| 2010/0142277 A1 | 6/2010 | Yang et al. | |
| 2010/0169743 A1 | 7/2010 | Vogan et al. | |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

Takeuchi et al., "A Multipage Cell Architecture for High-Speed Programming Multilevel NAND Flash Memories", IEEE Journal of Solid State Circuits, vol. 33, No. 8, Aug. 1998.

JEDEC Standard JESD84-C44, "Embedded MultiMediaCard (e•MMC) Mechanical Standard, with Optional Reset Signal", Jedec Solid State Technology Association, USA, Jul. 2009.

JEDEC, "UFS Specification", version 0.1, Nov. 11, 2009.

SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Agrell et al., "Closest Point Search in Lattices", IEEE Transactions on Information Theory, vol. 48, No. 8, pp. 2201-2214, Aug. 2002.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW' 2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

Sommer, N., U.S. Appl. No. 12/171,797 "Memory Device with Non-Uniform Programming Levels" filed Jul. 11, 2008.

Shalvi et al., U.S. Appl. No. 12/251,471 "Compensation for Voltage Drifts in Analog Memory Cells" filed Oct. 15, 2008.

U.S. Appl. No. 11/949,135 Official Action dated Oct. 2, 2009.

U.S. Appl. No. 12/880,101 "Reuse of Host Hibernation Storage Space by Memory Controller", filed Sep. 12, 2010.

U.S. Appl. No. 12/890,724 "Error Correction Coding Over Multiple Memory Pages", filed Sep. 27, 2010.

U.S. Appl. No. 12/171,797 Official Action dated Aug. 25, 2010.

U.S. Appl. No. 12/497,707 Official Action dated Sep. 15, 2010.

U.S. Appl. No. 11/995,801 Official Action dated Oct. 15, 2010.

NUMONYX, "M25PE16: 16-Mbit, page-erasable serial flash memory with byte-alterability, 75 MHz SPI bus, standard pinout", Apr. 2008.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

U.S. Appl. No. 11/945,575 Official Action dated Aug. 24, 2010.

U.S. Appl. No. 12/045,520 Official Action dated Nov. 16, 2010.

Engineering Windows 7, "Support and Q&A for Solid-State Drives", e7blog, May 5, 2009.

U.S. Appl. No. 11/995,814 Official Action dated Dec. 17, 2010.

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action dated May 20, 2010.

Shalvi et al., U.S. Appl. No. 12/822,207 "Adaptive Over-Provisioning in Memory Systems" filed Jun. 24, 2010.

U.S. Appl. No. 12/251,471 Official Action dated Jan. 3, 2011.

Super User Forums, "SD Card Failure, can't read superblock", posted Aug. 8, 2010.

Ubuntu Forums, "Memory Stick Failed IO Superblock", posted Nov. 11, 2009.

"How to Resolve "Bad Super Block: Magic Number Wrong" in BSD", Free Online Articles Director ARTICLE BASE, posted Sep. 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.
U.S. Appl. No. 12/987,174 filed on Jan. 10, 2011.
U.S. Appl. No. 12/987,175 filed on Jan. 10, 2011.
U.S. Appl. No. 12/963,649 filed on Dec. 9, 2010.
U.S. Appl. No. 13/021,754 filed on Feb. 6, 2011.
US 7,161,836, 01/2007, Wan et al. (withdrawn)

* cited by examiner

PROGRAMMING OF ANALOG MEMORY CELLS USING A SINGLE PROGRAMMING PULSE PER STATE TRANSITION

CROSS-REFERENCE TO RELATED APPLICATIONS

This application claims the benefit of U.S. Provisional Patent Application 61/030,240, filed Feb. 21, 2008, and U.S. Provisional Patent Application 61/031,712, filed Feb. 27, 2008, whose disclosures are incorporated herein by reference.

FIELD OF THE INVENTION

The present invention relates generally to memory devices, and particularly to methods and systems for programming analog memory cells.

BACKGROUND OF THE INVENTION

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as storage values or analog values. In Flash memories, for example, each analog memory cell holds a certain amount of electrical charge. The range of possible analog values is typically divided into regions, each region corresponding to a programming state that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Various methods and systems for programming memory cells are known in the art. For example, PCT International Publication WO 2008/083131, whose disclosure is incorporated herein by reference, describes a method for programming non-volatile storage elements. A trial programming process is performed for a first set of one or more non-volatile storage elements to test usage of the non-volatile storage system. Based on this trial programming, a programming signal is calibrated by adjusting its initial magnitude. The calibrated programming signal is then used to program a second set of non-volatile storage elements.

PCT International Publication WO 2008/124760, whose disclosure is incorporated herein by reference, describes a predictive programming mode for programming an array of non-volatile memory cells, which are individually programmable to one of a range of threshold voltage levels. A predetermined function predicts what programming voltage level needs to be applied in order to program a given memory cell to a given target threshold voltage level. In an embodiment, the predetermined function is linear and is calibrated for each memory cell under programming by one or more checkpoints. The checkpoint is an actual programming voltage that programs the memory cell in question to a verified designated threshold voltage level.

SUMMARY OF THE INVENTION

An embodiment of the present invention provides a method for data storage in analog memory cells, including:

defining multiple programming states for storing data in the analog memory cells, such that the programming states represent respective combinations of more than one bit and correspond to respective, different levels of a physical quantity stored in the memory cells; and storing the data in the memory cells by applying to the memory cells programming pulses that cause the levels of the physical quantity stored in the memory cells to transition between the programming states, such that a given transition is caused by only a single programming pulse.

In some embodiments, the method includes measuring respective values of a property of the memory cells, and setting respective amplitudes of the programming pulses applied to the memory cells responsively to the measured values of the property. In a disclosed embodiment, setting the amplitudes includes setting a first amplitude of a first programming pulse for causing a transition between a given pair of the programming states in a first memory cell, and setting a second amplitude, different from the first amplitude, of a second programming pulse for causing the transition between the given pair of the programming states in a second memory cell, different from the first memory cell.

In an embodiment, the property includes a responsiveness of the memory cells to the programming pulses. Additionally or alternatively, the property may include a number of prior Programming and Erasure (P/E) cycles applied to the memory cells. Further additionally or alternatively, the property may include a temperature of the memory cells. In another embodiment, the memory cells are divided into multiple groups, and setting the amplitudes includes setting a respective common amplitude for the memory cells in each of the groups. In some embodiments, the method includes setting one or more reading parameters responsively to the measured values of the property, and reading the data from the memory cells using the reading parameters. The reading parameters may include respective positions of one or more read thresholds that are used for reading the data from the memory cells. In some embodiments, setting the amplitudes includes applying respective calibration pulses to the memory cells, sensing the respective levels of the physical quantity that are stored in the memory cells by the calibration pulses, and calculating the amplitudes based on the sensed levels of the physical quantity.

In an embodiment, the method includes retrieving the data from the memory cells by sensing the respective levels of the physical quantity so as to determine the programming states of the memory cells, and reconstructing the data based on the determined programming states. In a disclosed embodiment, storing the data includes encoding the data with an Error Correction Code (ECC), and reconstructing the data includes decoding the ECC. In another embodiment, reconstructing the data includes canceling interference that distorts the levels of the physical quantity of the memory cells. In yet another embodiment, retrieving the data includes determining the programming states by comparing the sensed levels of the physical quantity to one or more read thresholds, and adjusting respective positions of the read thresholds so as to successfully reconstruct the data.

There is additionally provided, in accordance with an embodiment of the present invention, a method for data storage in analog memory cells, including:

defining multiple programming states for storing data in the analog memory cells, such that the programming states represent respective combinations of more than one bit and correspond to respective, different levels of a physical quantity stored in the memory cells; and storing the data in the memory cells by applying to the memory cells programming pulses that cause the levels of the physical quantity stored in the memory cells to transition between the programming states, such that a given transition is caused by one or more programming pulses that are applied without verifying the levels of the physical quantities caused by the programming pulses.

There is also provided, in accordance with an embodiment of the present invention, a data storage apparatus, including:

a plurality of analog memory cells, for which multiple programming states are defined, such that the programming states represent respective combinations of more than one bit and correspond to respective, different levels of a physical quantity stored in the memory cells; and circuitry, which is coupled to the memory cells and is configured to store data in the memory cells by applying to the memory cells programming pulses that cause the levels of the physical quantity stored in the memory cells to transition between the programming states, such that a given transition is caused by only a single programming pulse.

The present invention will be more fully understood from the following detailed description of the embodiments thereof, taken together with the drawings in which:

DETAILED DESCRIPTION OF EMBODIMENTS

Overview

Figure 1:
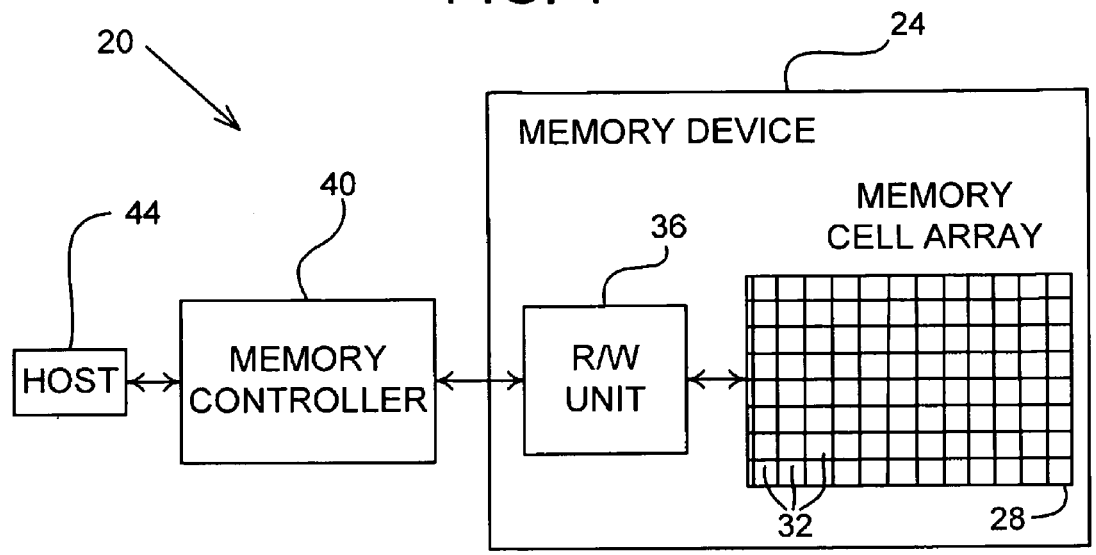
FIG. 1 is a block diagram that schematically illustrates a memory system, in accordance with an embodiment of the present invention.

Analog memory cells typically hold certain levels of a physical quantity (e.g., electrical charge), which represent the data stored in the cells. Multiple programming states are typically defined, such that each programming state represents a certain stored data value and corresponds to a certain level of the physical quantity.

Analog memory cells are often programmed by applying programming pulses to the cells. The programming pulses change the levels of the physical quantity stored in the cells, and thus transition the cells from one programming state to another. In some cases, a programming operation transitions a given memory cell from an erased state to a non-erased state. In other cases, e.g., in a multi-level cell, the memory cell may already be programmed to a certain non-erased state, and the programming operation transitions the cell to another programming state.

Embodiments of the present invention that are described hereinbelow provide improved methods and systems for programming analog memory cells. The methods and systems described herein are particularly suitable for MLC devices, i.e., memory cells that store more than one bit per cell, but can be used with SLC devices, as well. The methods and systems described herein program the memory cells such that a given state transition is carried out by applying only a single programming pulse. Unlike some known programming methods that apply sequences of programming pulses and/or verify the cell values after programming, the methods and systems described herein apply the single programming pulses in open loop, without verification. As a result, high programming speed can be achieved.

In many practical cases, however, the responsiveness of memory cells to programming pulses may differ considerably from one cell or cell group to another. In such cases, applying programming pulses in open loop may cause the levels of the physical quantity stored in the cells to have a wide distribution, which increases the likelihood of read errors. Several methods for narrowing and controlling the mean values of these distributions, without compromising the speed of open-loop single-pulse programming, are described herein.

In some embodiments, the amplitudes of the programming pulses are adjusted prior to data storage based on various properties of the memory cells. When using such an adjustment process, the amplitudes of the programming pulses applied to a given memory cell or group of cells are matched to the properties of that memory cell or cell group. Thus, the physical quantity levels assumed by the cells in response to the programming operation have a relatively narrow distribution having a controlled mean value, even though the responsiveness of different cells or groups of cells to programming may vary considerably. Additionally or alternatively, techniques such as read threshold tracking and Error Correction Coding (ECC) may be used to achieve good error performance in the presence of the relatively wide distributions caused by open-loop programming.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog level of a physical quantity, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 may comprise Single-Level Cells (SLC) or Multi-Level Cells (MLC, also referred to as multi-bit cells).

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming states are selected from a finite set of possible states, and each state corresponds to a certain nominal storage value. For example, a 2 bit/cell MLC can be programmed to assume one of four possible programming states by writing one of four possible nominal storage values to the cell. The number of bits stored in each cell is not necessarily integer. In other words, the number of programming states may not necessarily be a power of 2. For example, three programming states can be defined per memory cell.

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. The R/W unit typically reads data from cells 32 by comparing the storage values of the cells to one or more read thresholds. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a memory controller 40. In some embodiments, controller 40 produces the storage values for storing in the memory cells and provides these values to R/W unit 36. Alternatively, controller 40 may provide the data for storage, and the conversion to storage values is carried out by the R/W unit internally to the memory device.

Memory controller 40 communicates with a host 44, for accepting data for storage in the memory device and for outputting data retrieved from the memory device. In some embodiments, some or even all of the functions of controller 40 may be implemented in hardware. Alternatively, controller 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC). Further alternatively, some or all of the circuitry of the memory controller may reside on the same die on which the memory array is disposed. Further alternatively, some or all of the functionality of controller 40 can be implemented in software and carried out by a processor or other element of the host system. In some implementations, a single memory controller may be connected to multiple memory devices 24. In yet another embodiment, some or all of the memory controller functionality may be carried out by a separate unit, referred to as a memory extension, which acts as a slave of memory device 24. Typically, controller 40 comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 32 of array 28 are typically arranged in a grid having multiple rows and columns, commonly referred to as word lines and bit lines, respectively. The array is typically divided into multiple pages, i.e., groups of memory cells that are programmed and read simultaneously. Cells are typically erased in groups of word lines that are referred to as erasure blocks. In some embodiments, a given memory devices comprises multiple memory cell arrays, which may be fabricated on separate dies.

Cell Responsiveness to Programming, and its Effect on Storage Reliability

R/W unit 36 programs memory cells 32 by applying programming pulses (e.g., voltage pulses) to the cells. For example, when cells 32 comprise floating-gate Flash cells, the R/W unit applies programming pulses to the gates of the cells. In a typical Flash device configuration, the gates of multiple cells are connected to a common word line, and the R/W unit is able to program multiple cells in parallel by applying programming pulses to the word line.

A given programming pulse causes a given memory cell to assume a given storage value, which corresponds to a certain level of a physical quantity. For example, in a Flash memory cell, a given programming pulse causes the memory cell to accumulate a given amount of electrical charge, so as to assume a given threshold voltage. The description that follows refers mainly to Flash cells whose charge levels (or threshold voltages) represent stored data. Alternatively, however, the methods and systems described herein can be used with various other sorts of analog memory cells that hold various other kinds of physical quantities and storage values.

Memory cells 32, or groups of cells 32, may differ from one another in their responsiveness to programming pulses. The term "responsiveness to programming" is used to describe the extent to which a given memory cell reacts to a given programming pulse in assuming its intended physical quantity level or storage value. When a programming pulse having a given amplitude is applied to multiple memory cells, some cells (referred to as low-responsiveness cells) may accumulate less charge and assume a lower threshold voltage, while other cells (referred to as high-responsiveness cells) may accumulate more charge and assume a higher threshold voltage. In other words, responsiveness to programming is a relative measure, which compares the physical quantities or storage values assumed by different cells or groups of cells in response to a certain programming pulse or pulses.

Figure 4:
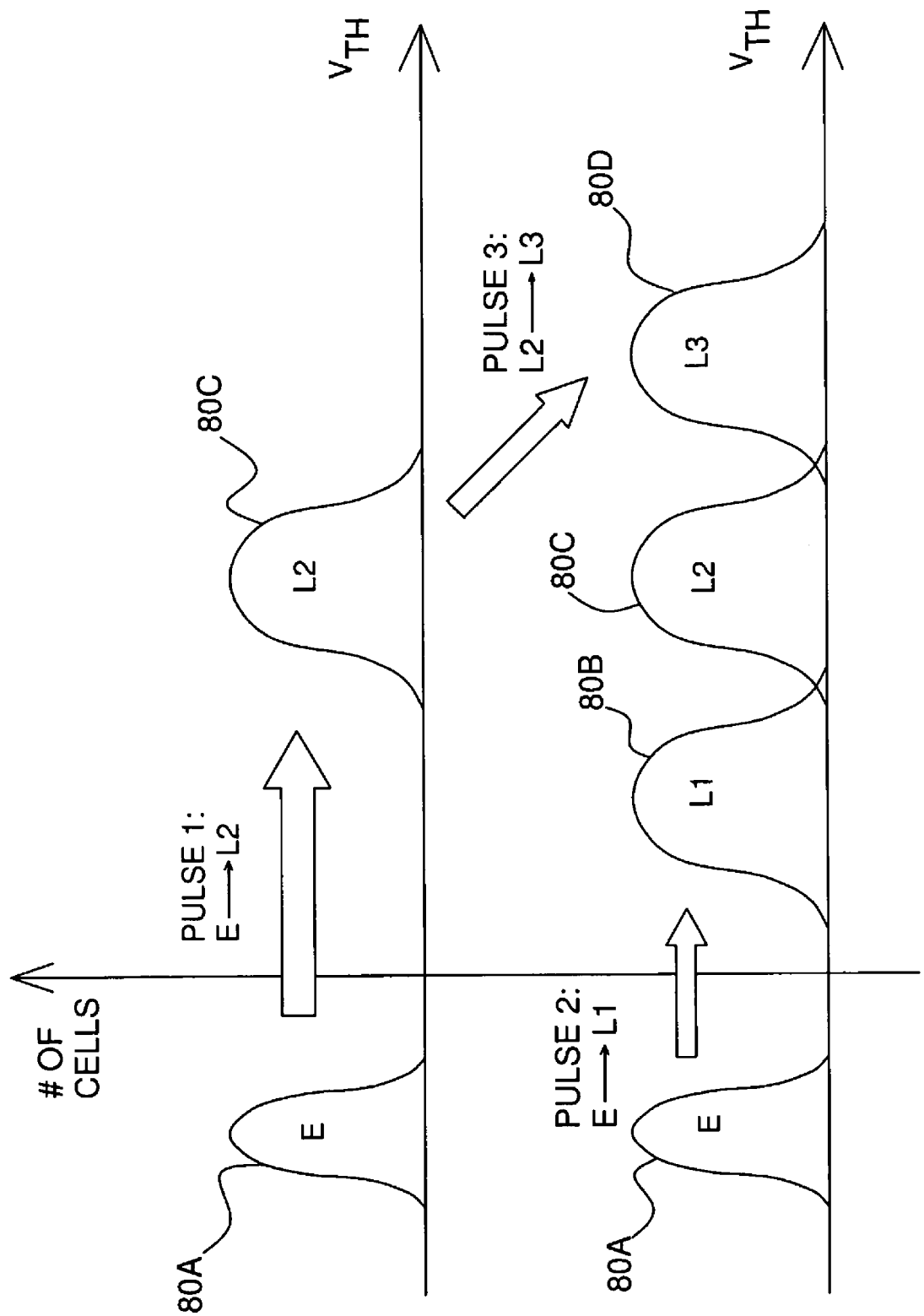
FIG. 4 is a diagram that schematically illustrates a process for programming multi-level analog memory cells, in accordance with an embodiment of the present invention.

The difference in responsiveness to programming pulses among different cells is one of the factors that cause the storage values of the cells to vary from their intended target levels after programming. The storage values in a group of N-level memory cells will typically be distributed around the N nominal storage values that represent the N programming states. FIG. 4 below shows an example of storage value distributions in a group of four-level memory cells.

The variance of the storage value distributions, and the separation between the distributions, have a considerable detrimental effect on the storage reliability of the memory cells, i.e., on the probability of read errors. As noted above, reading data from the memory cells is typically performed by comparing their storage values to one or more read thresholds, attempting to associate the read storage values to the programming states correctly. When the distributions are wide and/or closely-spaced, the likelihood of storage values to fall on the wrong side of a read threshold increases. This effect is particularly severe in multi-level memory cells, in which the separation between adjacent programming states is relatively small.

Programming Memory Cells Using a Single Programming Pulse Per State Transition

For a given memory cell, a given programming operation can be viewed as a transition from one programming state of the cell to another. Consider, for example, a four-level cell in which four programming states denoted L1 . . . L4 are represented by four respective nominal threshold voltages. Such a cell can store two data bits. In the present example, memory states L1 . . . L4 represent the bit combinations "11", "10", "00" and "01", respectively. State L1 also represents an erased state (i.e., when a block of cells is erased, the cells in the block are set to state L1, which is often represented by a negative threshold voltage). In this example, programming an erased cell to store "01" data can be viewed as a transition from state L1 to state L4. When a cell is already at state L3 (i.e., holds the data "00", the cell can be programmed to store "01" using a transition from state L3 to state L4.

Embodiments of the present invention provide improved methods and systems for programming analog memory cells. The methods and systems described herein carry out a given state transition by applying only a single programming pulse. As a result, programming operations applied to the memory cells are extremely fast and enable high programming speed. In some embodiments, the amplitude of the programming pulse applied to a given cell is pre-calculated based on certain properties of the cell, so as to control the mean value and reduce the variance of the resulting storage value distributions.

Figure 2:
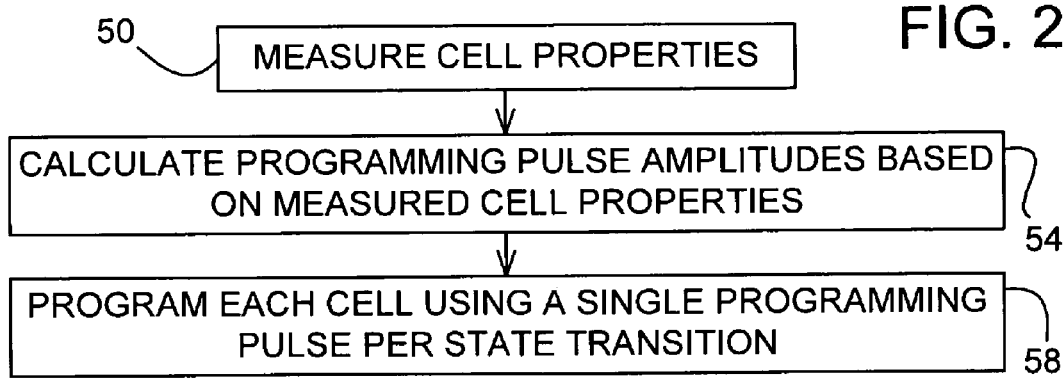
FIG. 2 is a flow chart that schematically illustrates a method for programming analog memory cells, in accordance with an embodiment of the present invention.

FIG. 2 is a flow chart that schematically illustrates a method for programming memory cells 32, in accordance with an embodiment of the present invention. The method begins with system 20 performing a calibration process that measures certain properties of cells 32, e.g., the responsiveness of the cells to programming, at a calibration step 50. The results of the calibration process are used for calculating the appropriate amplitudes of the programming pulses applied to the memory cells in subsequent programming operations.

In an example calibration process, controller 40 applies calibration pulses having known amplitudes to cells or groups of cells. The memory controller then reads the storage values assumed by the cells in response to the calibration pulses. Using the read results, the memory controller assesses the responsiveness of each cell or group of cells to programming. The calibration results may be stored in memory controller 40 or in memory device 24 for later use.

The calibration process may be performed at any desired stage during the lifetime of device 24, such as during production, during power-up or initialization of the memory device in a host system, or even during normal operation of the memory device in the host system (e.g., during idle periods in which memory access operations are not performed).

The memory controller may assess the responsiveness to programming of individual cells, or collectively for groups of cells, e.g., word lines. In an example embodiment, the memory controller may hold a nominal pulse amplitude that is to be applied to a certain word line in order to cause a certain state transition. Based on the calibration results, the memory controller may compute an offset from the nominal pulse amplitude for each word line. The offset corresponding to a given word line can be used to scale the programming pulses applied to this word line.

When intending to store data in memory cells 32, memory controller 40 calculates the appropriate amplitudes of the programming pulses to be applied to the memory cells based on the calibration results, at an amplitude calculation step 54. The memory controller programs the cells by applying the programming pulses, at a programming step 58. Each cell is programmed by applying a single programming pulse. In other words, each transition between programming states in a given cell is performed by applying a single programming pulse.

When programming the cells, the memory controller sets the amplitudes of the programming pulses to the values calculated at step 54 above. Since the amplitude of each programming pulse is matched to the properties of the cell in which the pulse is applied, the distribution of storage values assumed by the cells is relatively narrow. As a result, the likelihood of subsequent read errors is reduced.

In the description above, the amplitudes of programming pulses are adjusted based on the estimated programming responsiveness of the cells. Additionally or alternatively, system 20 may calculate the pulse amplitudes based on any other suitable property of cells 32, such as, for example, the number of Programming and Erasure (P/E) cycles the cells have gone through, or the temperature of the memory device. Since the programming responsiveness of the cells may vary with the number of P/E cycles, the calibration process described above may be repeated periodically in order to account for these changes. When the memory device employs wear leveling techniques that distribute P/E cycles evenly among different cell groups, periodic calibration may be performed for the entire memory device. When different cell groups differ from one another considerably in the number of P/E cycles, each cell group can be calibrated at suitable time intervals, as appropriate.

Further additionally or alternatively, the dependence of the calibration results (e.g., offsets to programming pulse amplitudes) on the number of P/E cycles can be studied and modeled a-priori, and then compensated for during operation without a need for periodic calibration. This a-priori modeled dependence can also be used as side information that assists or complements the periodic calibration process.

Improved Reading of Cells that were Programmed Using a Single Pulse Per State Transition In some embodiments, system 20 employs certain techniques for enhancing the performance of reading data from memory cells 32, in conjunction with the single-pulse programming schemes described above. These reading techniques may either replace the pre-programming calibration processes described above, or complement such calibration processes. In either case, such reading techniques are able to reliably reconstruct the stored data even though the storage value distributions in cells 32 may have relatively high variances. Moreover, reading techniques are sometimes used to compensate for cross-coupling interference from neighboring cells, which may be present in the storage values of cells 32.

For example, memory controller 40 may encode the stored data using an Error Correction Code (ECC), such as a Low-Density Parity Check (LDPC) code, a Bose-Chaudhuri-Hocquenghem (BCH) code or any other suitable ECC. Additionally or alternatively, the memory controller may employ methods for canceling cross-coupling interference and other distortion in the storage values of the memory cells. Further additionally or alternatively, the memory controller may apply methods that adaptively track and adjust the values of the read thresholds used for reading the data from the memory cells.

In some embodiments, the memory controller may use a separate set of reading parameters (e.g., read thresholds) for each group of cells (e.g., for each word line, block or memory cell array). In some embodiments, the reading parameters (e.g., values of read thresholds) can be set based on the calibration results described above.

Techniques for adaptively adjusting read threshold values are described, for example, in PCT International Publications WO 2008/053472 and WO 2008/111058, whose disclosures are incorporated herein by reference. Techniques for estimating and cancelling distortion in memory cells are described, for example, in PCT International Publications WO 2007/132452, WO 2007/132453, WO 2007/132457 and WO 2008/026203, whose disclosures are incorporated herein by reference. ECC techniques for use in analog memory cells are described, for example, in PCT International Publication WO 2007/132457, cited above.

Figure 3:
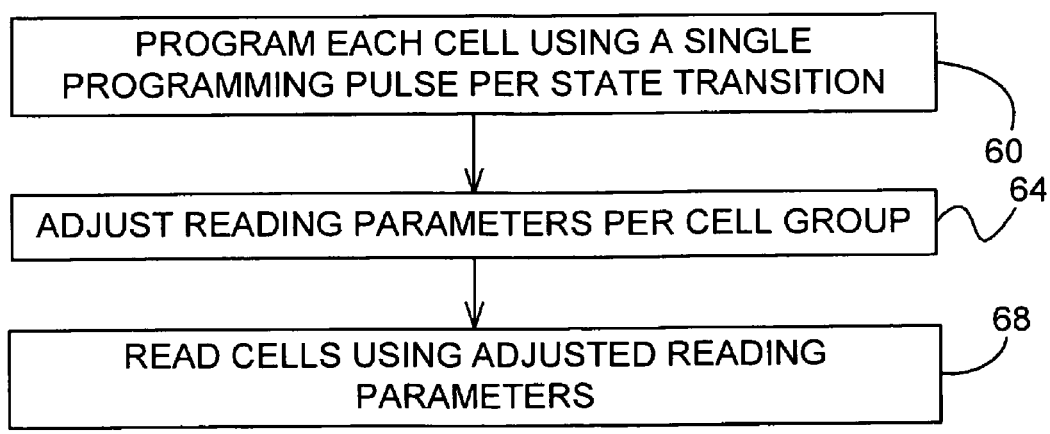
FIG. 3 is a flow chart that schematically illustrates a method for programming and reading analog memory cells, in accordance with an embodiment of the present invention.

FIG. 3 is a flow chart that schematically illustrates a method for programming and reading analog memory cells 32, in accordance with an embodiment of the present invention. The method begins with memory controller 40 programming memory cells 32 using a single programming pulse per state transition, at a single-pulse programming step 60. The memory controller adjusts the reading parameters for each cell group (e.g., word line, block or array), at a reading adjustment step 64. The memory controller then reads the data from a given cell group using its respective set of reading parameters, at a reading step 68.

In the description of FIGS. 2 and 3 above, the different calibration, calculation and parameter setting operations are performed by memory controller 40. This configuration, however, is chosen purely by way of example, and the methods and systems described herein are in no way limited to this sort of configuration. In alternative embodiments, any of the functions described above can be performed by R/W unit 36. The different functions can be divided between the memory controller and the R/W unit in any suitable way. The memory controller and the R/W unit are regarded herein as processing circuitry, which is coupled to the memory cells and is configured to carry out the methods described herein.

FIG. 4 is a diagram that demonstrates a process for programming a group of four-level cells using a single pulse per state transition, in accordance with an embodiment of the present invention. In the present example, each memory cell in the group has four programming states denoted E, L1, L2 and L3. State E also functions as the erased state. When the cells are programmed using a single pulse per state transition, the storage values associated with states E, L1, L2 and L3 are distributed in accordance with distributions 80A . . . 80D, respectively. The group of cells stores two memory pages, such that the two bits of each cell belong to the two pages.

When programming is initiated, all cells are assumed to be erased, i.e., in state E. Programming of the first page is shown in the top half of the figure. The first page is programmed by applying a single pulse (denoted PULSE1 in the figure) to the cells in which the first bit is "0". After this programming operation, the cells in which the first bit is "0" are transitioned to state L2, while the cells in which the first bit is "1" remain in state E.

The second bit is programmed as follows: For cells that are in state E and in which the second bit is "0", a single pulse denoted PULSE2 is applied, causing these cells to transition to state L1. For cells that are in state E and in which the second bit is "1", no pulse is applied and these cells remain in state E. For cells that are in state L2 and in which the second bit is "1", a single pulse denoted PULSE3 is applied, causing these cells to transition to state L3. For cells that are in state L2 and in which the second bit is "0", no pulse is applied and these cells remain in state L2. Thus, the group of four-level cells is programmed to store two memory pages by selectively applying three programming pulses, such that each state transition is carried out using only a single programming pulse.

In the present example, the nominal storage values of states L1, L2 and L3 are 1V, 2V and 3V, respectively. The amplitudes of pulses PULSE1, PULSE2 and PULSE3 are set, using the calibration methods described above, to 17V, 16V and 18V, respectively. The three pulses are assumed to have the same time duration. In alternative embodiments, any other suitable values can also be used. Note that the programming order shown in FIG. 4, i.e., the order in which the different programming pulses are applied, is chosen by way of example. Various other programming orders, which use a single pulse per state transition, can also be used.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage in analog memory cells, comprising:
defining multiple programming states for storing data in the analog memory cells, such that the programming states represent respective combinations of more than one bit and correspond to respective, different levels of a physical quantity stored in the memory cells; and
storing the data in the memory cells by applying to the memory cells programming pulses that cause the levels of the physical quantity stored in the memory cells to transition between the programming states, such that a given transition is caused by only a single programming pulse, without verifying the levels of the physical quantities caused by the programming pulses.

2. The method according to claim 1, and comprising measuring respective values of a property of the memory cells, and setting respective amplitudes of the programming pulses applied to the memory cells responsively to the measured values of the property.

3. The method according to claim 2, wherein setting the amplitudes comprises setting a first amplitude of a first programming pulse for causing a transition between a given pair of the programming states in a first memory cell, and setting a second amplitude, different from the first amplitude, of a second programming pulse for causing the transition between the given pair of the programming states in a second memory cell, different from the first memory cell.

4. The method according to claim 2, wherein the property comprises a responsiveness of the memory cells to the programming pulses.

5. The method according to claim 2, wherein the property comprises a number of prior Programming and Erasure (P/E) cycles applied to the memory cells.

6. The method according to claim 2, wherein the property comprises a temperature of the memory cells.

7. The method according to claim 2, wherein the memory cells are divided into multiple groups, and wherein setting the amplitudes comprises setting a respective common amplitude for the memory cells in each of the groups.

8. The method according to claim 2, and comprising setting one or more reading parameters responsively to the measured values of the property, and reading the data from the memory cells using the reading parameters.

9. The method according to claim 8, wherein the reading parameters comprise respective positions of one or more read thresholds that are used for reading the data from the memory cells.

10. The method according to claim 2, wherein setting the amplitudes comprises applying respective calibration pulses to the memory cells, sensing the respective levels of the physical quantity that are stored in the memory cells by the calibration pulses, and calculating the amplitudes based on the sensed levels of the physical quantity.

11. The method according to claim 1, and comprising retrieving the data from the memory cells by sensing the respective levels of the physical quantity so as to determine the programming states of the memory cells, and reconstructing the data based on the determined programming states.

12. The method according to claim 11, wherein storing the data comprises encoding the data with an Error Correction Code (ECC), and wherein reconstructing the data comprises decoding the ECC.

13. The method according to claim 11, wherein reconstructing the data comprises canceling interference that distorts the levels of the physical quantity of the memory cells.

14. The method according to claim 11, wherein retrieving the data comprises determining the programming states by comparing the sensed levels of the physical quantity to one or more read thresholds, and adjusting respective positions of the read thresholds so as to successfully reconstruct the data.

15. A data storage apparatus, comprising:
a plurality of analog memory cells, for which multiple programming states are defined, such that the programming states represent respective combinations of more than one bit and correspond to respective, different levels of a physical quantity stored in the memory cells; and
circuitry, which is coupled to the memory cells and is configured to store data in the memory cells by applying to the memory cells programming pulses that cause the levels of the physical quantity stored in the memory cells to transition between the programming states, such that a given transition is caused by only a single programming pulse, without verifying the levels of the physical quantities caused by the programming pulses.

16. The apparatus according to claim 15, wherein the circuitry is configured to measure respective values of a property of the memory cells, and to set respective amplitudes of the programming pulses applied to the memory cells responsively to the measured values of the property.

17. The apparatus according to claim 16, wherein the circuitry is configured to set a first amplitude of a first programming pulse for causing a transition between a given pair of the programming states in a first memory cell, and to set a second amplitude, different from the first amplitude, of a second programming pulse for causing the transition between the given pair of the programming states in a second memory cell, different from the first memory cell.

18. The apparatus according to claim 16, wherein the property comprises a responsiveness of the memory cells to the programming pulses.

19. The apparatus according to claim 16, wherein the property comprises a number of prior Programming and Erasure (P/E) cycles applied to the memory cells.

20. The apparatus according to claim 16, wherein the property comprises a temperature of the memory cells.

21. The apparatus according to claim 16, wherein the memory cells are divided into multiple groups, and wherein the circuitry is configured to set a respective common amplitude for the memory cells in each of the groups.

22. The apparatus according to claim 16, wherein the circuitry is configured to set one or more reading parameters responsively to the measured values of the property, and to read the data from the memory cells using the reading parameters.

23. The apparatus according to claim 21, wherein the reading parameters comprise respective positions of one or more read thresholds that are used for reading the data from the memory cells.

24. The apparatus according to claim 16, wherein the circuitry is configured to apply respective calibration pulses to the memory cells, to sense the respective levels of the physical quantity that are stored in the memory cells by the calibration pulses, and to calculate the amplitudes based on the sensed levels of the physical quantity.

25. The apparatus according to claim 15, wherein the circuitry is configured to retrieve the data from the memory cells by sensing the respective levels of the physical quantity so as to determine the programming states of the memory cells, and reconstructing the data based on the determined programming states.

26. The apparatus according to claim 25, wherein the circuitry is configured to encode the data with an Error Correction Code (ECC), and to reconstruct the data by decoding the ECC.

27. The apparatus according to claim 25, wherein the circuitry is configured to reconstruct the data by canceling interference that distorts the levels of the physical quantity of the memory cells.

28. The apparatus according to claim 25, wherein the circuitry is configured to determine the programming states by comparing the sensed levels of the physical quantity to one or more read thresholds, and to adjust respective positions of the read thresholds so as to successfully reconstruct the data.

* * * * *